United States Patent [19]

Jordan

[11] Patent Number: 4,973,978
[45] Date of Patent: Nov. 27, 1990

[54] VOLTAGE COUPLING CIRCUIT FOR DIGITAL-TO-TIME CONVERTER

[75] Inventor: E. Perry Jordan, Greensboro, N.C.

[73] Assignee: Analog Devices, Inc., Norwood, Mass.

[21] Appl. No.: 401,066

[22] Filed: Aug. 31, 1989

[51] Int. Cl.⁵ .............................................. H03M 1/82
[52] U.S. Cl. ..................................... 341/152; 307/234; 328/129.1
[58] Field of Search ............... 341/118, 119, 121, 138, 341/152, 120; 307/234; 328/129.1

[56] References Cited

U.S. PATENT DOCUMENTS

| | | | |
|---|---|---|---|
| 3,654,494 | 4/1972 | Bartlett et al. | 328/129.1 |
| 4,044,272 | 8/1977 | Darrow | 328/129.1 |
| 4,150,368 | 4/1979 | Chea, Jr. | 341/138 |
| 4,381,497 | 4/1983 | Lillis et al. | 341/119 |
| 4,492,954 | 1/1985 | Harris et al. | 341/118 |
| 4,742,331 | 5/1988 | Barrow et al. | 341/152 |

Primary Examiner—William M. Shoop, Jr.
Assistant Examiner—Randy W. Gibson
Attorney, Agent, or Firm—Wolf, Greenfield & Sacks

[57] ABSTRACT

A voltage coupling circuit for use in a digital-to-time converter insures that converter operation is stabilized against temperature and power supply variations. The digital-to-time converter operates by comparing a ramp voltage to a threshold voltage that is set in accordance with an input digital word. The voltage coupling circuit, which causes the ramp voltage to track changes in the threshold voltage, includes a current mirror arrangement that separates the voltage coupling and ramp generation functions. As a result, transistor base currents are not drawn through the ramp capacitor, and accuracy is improved in the case of long time delays.

14 Claims, 3 Drawing Sheets

VOLTAGE COUPLING CIRCUIT FOR DIGITAL-TO-TIME CONVERTER

FIELD OF THE INVENTION

This invention relates to a circuit for converting the value of a digital word into a proportional time delay and, more particularly, to a voltage coupling circuit having stable, accurate operation over a range of temperatures and power supply variations.

BACKGROUND OF THE INVENTION

A digital to time converter is a circuit which accepts a digital signal and produces a proportional time delay. The delay appears as a time difference between two pulses appearing at the output of the device or between a trigger pulse and a pulse appearing at the output of the device. Digital-to time conversion is usually performed by comparing a linearly increasing voltage or current ramp to a threshold voltage or current. In one form of digital-to time converter, a fixed threshold voltage is compared to a ramp voltage having a variable slope. The slope of the ramp voltage is determined from the value of the input digital word. In another form of the converter, a ramp voltage with a fixed slope is compared to a variable threshold voltage whose level is determined in accordance with the input digital word. In either case, when the ramp voltage equals the value of the threshold voltage, a pulse signal is generated. The time between the start of the ramp signal and the pulse signal represents the value of the digital word.

A monolithic integrated circuit capable of accurate digital-to-time conversion over a range of temperatures and power supply variations is disclosed in U.S. Pat. No. 4,742,331, issued May 3, 1988 to Barrow et al and assigned to the assignee of the present application. The disclosed digital to time converter compares a ramp voltage with a threshold voltage whose level is set in accordance with the input digital word. The ramp voltage is generated by charging a ramp capacitor with a current whose value is determined by a ramp resistor. The ramp resistor and/or the ramp capacitor are externally selectable to provide different time delay ranges. In order to stabilize the device, a voltage coupling circuit ensures that changes in the ramp voltage caused by temperature and power supply variations track changes in the threshold voltage. Thus, temperature and power supply variations produce a common mode signal which is rejected by the comparator that compares the ramp voltage and the threshold voltage. The disclosed converter provides highly satisfactory operation over a range of time delays.

The digital-to time converter disclosed in Pat. No. 4,742,331 operates from positive and negative voltage supplies. It has been found desirable to provide a digital to-time converter which is TTL compatible, which operates from a single voltage supply and which is highly accurate, even for long time delays. For large values of the ramp resistor, the charging current is small, and normally negligible transistor base currents in the voltage coupling circuit become an appreciable percentage of the charging capacitor current. Such transistor base currents cause the ramp slope to differ from the desired slope, producing errors in the output time delay. It is desirable to provide accurate operation of the digital to time converter over a wide range of time delays.

It is a general object of the present invention to provide an improved digital-to time converter.

It is a further object of the present invention to provide a digital to time converter for generating accurate, long duration time delays.

It is a further object of the present invention to provide a digital to time converter for operation from a single voltage supply.

It is yet another object of the present invention to provide an improved voltage coupling circuit for stabilizing a digital to time converter.

It is a further object of the present invention to provide a voltage coupling circuit for stabilizing a digital-to time converter wherein transistor base current errors are eliminated.

SUMMARY OF THE INVENTION

According to the present invention, these and objects and advantages are achieved in a voltage coupling circuit for use in a digital to time converter circuit which converts the value of a digital word into a proportional time delay in response to a trigger signal by generating a threshold voltage proportional to a DAC current that is supplied by a digital-to analog converter in response to the digital word, charging a capacitor by means of a ramp current through a ramp resistor to generate a ramp voltage and generating an output representative of the time delay in response to the ramp voltage and the threshold voltage. The voltage coupling circuit comprises a reference resistor connected in series with the digital-to analog converter for generating a reference voltage in response to the DAC current, a first transistor having a collector connected in series between the capacitor and the ramp resistor, a second transistor having a collector connected in series between the digital-to-analog converter and the reference resistor, a third transistor having a base connected to a base of the first transistor, and a fourth transistor having a base connected to a base of the second transistor. The bases of the first and third transistors are connected to the collector of the fourth transistor through a first emitter follower circuit, and the bases of the second and fourth transistors are connected to the collector of the third transistor through a second emitter follower circuit so that the voltage across the reference resistor equals the voltage across the ramp resistor.

The voltage coupling circuit of the present invention eliminates time delay errors caused by base currents drawn by the first and second emitter follower circuits, since the base currents for the emitter follower circuits are not drawn through the DAC or the ramp capacitor. Thus, the effect of the base current drawn by the second emitter follower on the slope of the ramp voltage is eliminated. In addition, the voltage coupling circuit of the invention can be operated from a single supply voltage as low as four volts.

More particularly, the first and third transistors each include emitters connected to the ramp resistor, and the second and fourth resistors each include emitters connected to the reference resistor. The first and third transistors operate as a current mirror, and the second and fourth transistors operate as a current mirror. The capacitor charging current is, to a first order approximation, independent of base current drawn by the second emitter follower circuit, and the DAC current supplied to the reference resistor is, to a first order approximation, independent of the base current drawn by the first emitter follower circuit. Thus, the voltageto time converter provides accurate, long duration time delays independent of temperature and power supply variations.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
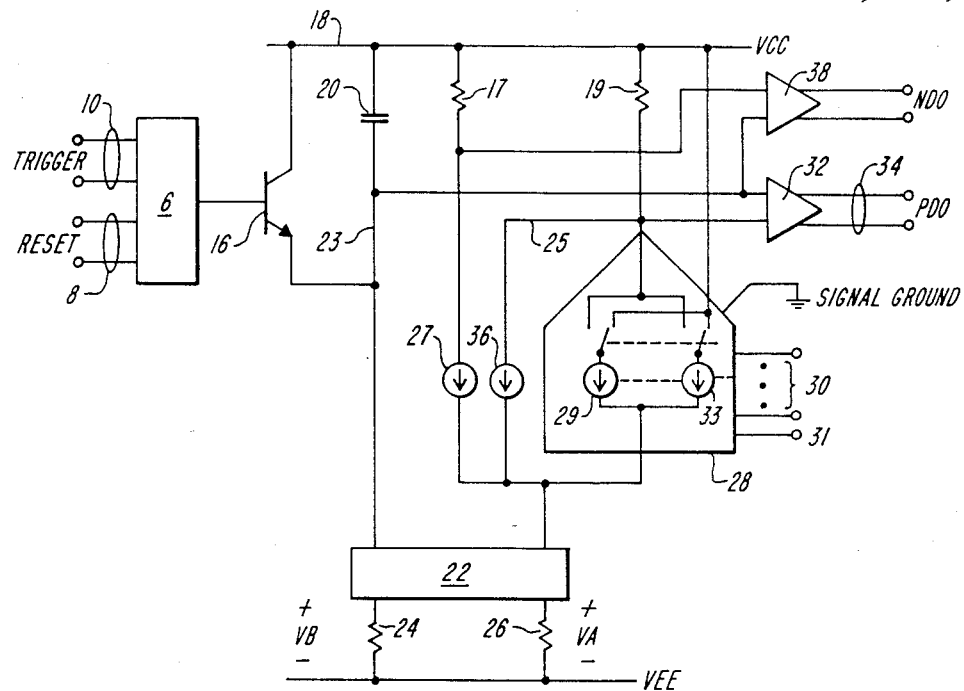
FIG. 1 is a block schematic diagram of a digital-to-time converter.

A block diagram of a digital-to-time converter is shown in FIG. 1. The converter has a TRIGGER input, a RESET input, a minimum delay output (MDO) and a programmed delay output (PDO). The TRIGGER input accepts a positive-going edge signal to trigger the circuit. After the circuit has been triggered and after a propagation delay, a pulse appears at the minimum delay output (MDO). Subsequently, after a programmed time delay depending on the values of an input digital word, a pulse appears at the programmed delay output (PDO). The time between the two pulses represents the time delay generated by the device. The RESET input is dominant over the TRIGGER input. In the presence of a RESET signal, the device cannot be triggered and if already triggered, it resets.

The TRIGGER signal on leads 10 is applied to ramp start circuitry 6, which controls the charging of a capacitor 20. The capacitor 20 generates the ramp voltage that is used to provide the programmed time delay. When the ramp start circuitry 6 is activated, it turns off a transistor 16 connected across capacitor 20. The capacitor 20 then begins charging through a voltage coupling circuit 22 and a ramp resistor 24.

The voltage across capacitor 20 is compared by a comparator 38 to a minimum delay voltage to generate the minimum delay output (MDO). The minimum delay voltage is generated across a resistor 17. A current source 27 creates an offset that maintains the output of comparator 38 in an off state when the circuit is not triggered. As capacitor 2 begins charging, the voltage across it exceeds the offset voltage, and comparator 38 provides an MDO signal.

The capacitor 20 voltage is also coupled to one input of a comparator 32 which provides the programmed delay output (PDO). The other input of comparator 32 is a threshold voltage generated by a digital-to-analog converter (DAC) 28, a resistor 19 and a current source 36. The DAC 28 accepts a digital word on inputs 30. The digital word is latched into converter 28 by a latch signal on a lead 31. The DAC effectively appears as a plurality of parallel-connected, binary-weighted current sources 29 to 33. In response to the digital word, converter 28 connects these current sources either to supply voltage 18 or to resistor 19. The current through each of the parallel sources is determined by components in the DAC 28 and components in voltage coupling circuit 22, so that the total DAC current is independent of the digital word. The current through resistor 19 causes a threshold voltage to develop at node 25. The value of the threshold voltage is dependent on the combination of current sources connected to resistor 19, which combination is in turn dependent on the value of the digital word and on the total DAC current.

The total DAC current passes through a reference resistor 26 to create a reference voltage $V_A$. The voltage $V_A$ is representative of changes in the DAC current caused by temperature and supply variations. Since the current through the resistor 19 is proportional to the total DAC current, the threshold voltage across resistor 19 is proportional to the reference voltage $V_A$, and variations in the threshold voltage caused by temperature and supply variations are represented by variations in the reference voltage $V_A$.

The voltage coupling circuit 22 forces a voltage $V_B$ appearing across the ramp resistor 24 to be equal to the reference volta $V_A$. Thus, the charging current to the ramp generating capacitor 20 and the resulting ramp voltage are dependent on the voltage $V_B$ which is equal to the reference voltage $V_A$. Variations in the threshold voltage across resistor 19 appear as corresponding variations in the ramp voltage. Since both the threshold voltage at node 25 and the ramp voltage at node 23 are applied to differential comparator 32, variations in voltages due to temperature changes, power supply variations or component variations appear as a common mode signal to differential comparator 32 and are rejected.

Comparator 32 provides an output when the ramp voltage at node 23 reaches the threshold voltage at node 25. The offset current source 36, which is connected to node 25, maintains comparator 32 in an off state in the absence of signals from capacitor 20 and DAC 28. Further details regarding the construction of the digital to time converter are provided in the aforementioned U.S. Pat. No. 4,742,331, which is hereby incorporated by reference.

Figure 2:
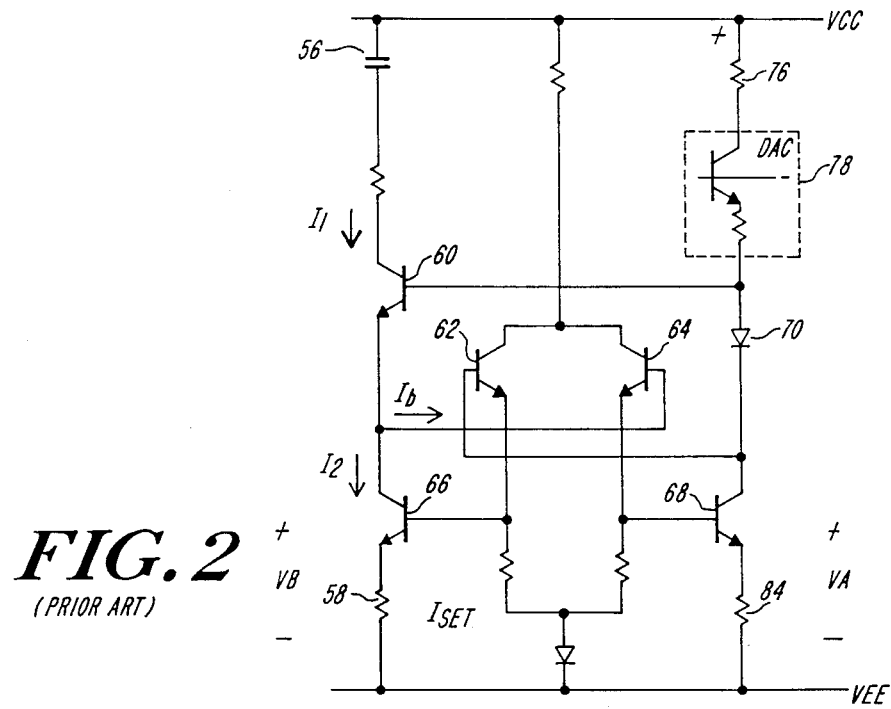
FIG. 2 is a schematic diagram of a ramp generator and voltage coupling circuit in accordance with the prior art.

A prior art ramp generator and voltage coupling circuit are shown in FIG. 2. The ramp generator circuit consists of timing capacitor 56 and timing resistor 58. The voltage coupling circuit consists of transistors 60, 62, 64, 66 and 68 and diode 70. When the digital to-time converter is triggered, capacitor 56 charges through transistors 60 and 66 and timing resistor 58. The threshold voltage is generated by a current drawn through a resistor 76 by a DAC 78. The DAC 78 converts the value of the digital word into a predetermined current through resistor 76 by selectively connecting internal current sources either to resistor 76 or to the power supply. The total DAC current flows from the DAC 78 through transistor 68, diode 70 and a reference resistor 84.

The voltage coupling circuit insures that the voltage across the timing resistor 58 is equal to the voltage across the reference resistor 84. As described in detail in the aforementioned U.S. Pat. No. 4,742,331, the voltage coupling circuit, including transistors 60–68 and diode 70, insures that the voltage across timing resistor 58 tracks the voltage across resistor 84 for temperature and power supply variations.

In order to obtain different ramp slopes, the value of timing resistor 58 or timing capacitor 56, or both, can be changed. For relatively large values of ramp current, the capacitor 56 current $I_1$ approximately equals the collector current $I_2$ of transistor 66 which in turn is approximately equal to the current $I_{set}$ through resistor 58. In this case, the base current $I_b$ of transistor 64 is negligible in comparison with current $I_2$. However, for large values of resistor 58 corresponding to long time delays, the base current $I_b$ of transistor 64 can be an appreciable fraction of the capacitor charging current $I_1$. The capacitor 56 current $I_1$ is increased by current $I_b$, thereby introducing an error into the slope of the ramp voltage. In a case where the base current $I_b$ is 5 microamps and the timing resistor current $I_{set}$ is 15 microamps, the capacitor 56 current $I_1$ is increased to 20 microamps. Thus, a significant error is introduced into the charging current for the capacitor 56, and the ramp slope differs from the desired value.

Figure 3:
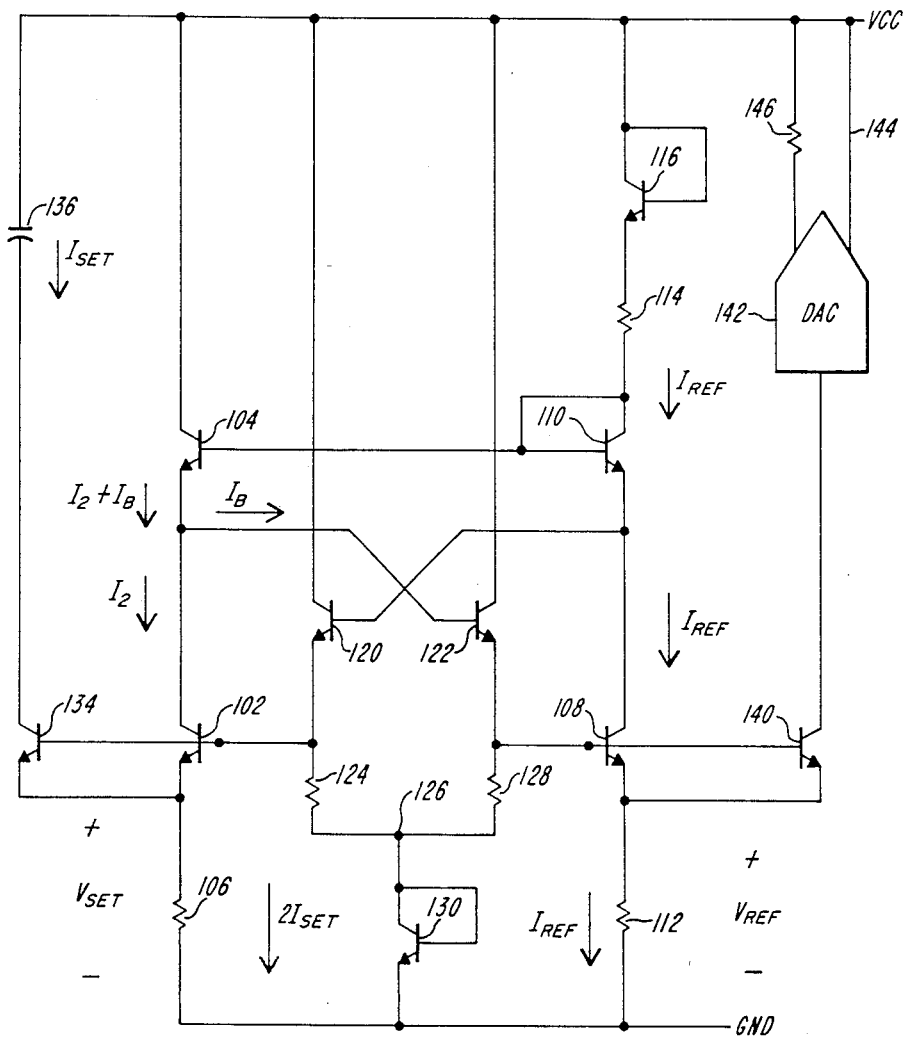
FIG. 3 is a simplified schematic diagram of a ramp generator and voltage coupling circuit in accordance with the present invention.

A ramp generator and voltage coupling circuit in accordance with the present invention are shown in FIG. 3. A transistor 102 and a transistor 104 are coupled in series between a positive voltage supply VCC and one side of a ramp resistor 106. The other side of ramp resistor is coupled to ground. A transistor 108 and a diode 110 are coupled in series to one side of a reference resistor 112. The other side of reference resistor 112 is coupled to ground. The anode of diode 110 is coupled through a resistor 114 and a diode 116 to the positive supply voltage VCC.

The base of transistor 102 is coupled through an emitter follower circuit including transistor 120 to the collector of transistor 108. The emitter of transistor 120 is connected to the base of transistor 102, and the base of transistor 120 is connected to the collector of transistor 108. The base of transistor 108 is coupled through an emitter follower circuit including transistor 122 to the collector of transistor 102. The emitter of transistor 122 is connected to the base of transistor 108, and the base of transistor 122 is connected to the collector of transistor 102. The collectors of transistors 120 and 122 are coupled to the positive voltage supply VCC. A resistor 124 is connected from the base of transistor 102 to node 126. A resistor 128 is connected between the base of transistor 108 and node 126. A diode 130 is connected between node 126 and around. The base of transistor 104 is connected to anode of diode 110. The coupling circuit comprising transistors 102, 104, 108, 120 and 122 and diode 110 insures that the voltage across reference resistor 112 equals the voltage across ramp resistor 106.

The circuit further includes a transistor 134 having a base connected to the base of transistor 102 and an emitter connected to the emitter of transistor 102. The collector of transistor 134 is coupled through a ramp capacitor 136 to the positive supply VCC. The circuit further includes a transistor 140 having a base connected to the base of transistor 108, and an emitter connected to the emitter of transistor 108. The collector of transistor 140 is coupled to DAC 142 and receives the total DAC current in the manner described above in connection with FIG. 1. Transistor 134 operates as a current mirror with transistor 102, and transistor 140 operates as a current mirror with transistor 108.

The DAC 142 is connected by line 144 to the positive supply voltage VCC and is connected through a threshold resistor 146 to the positive supply voltage VCC. The DAC 142 converts the value of an input digital word into a predetermined current through resistor 146 by selectively connecting internal current sources either to resistor 146 or to the positive supply voltage VCC.

The circuit shown in FIG. 3 and described hereinabove has the advantage that charging current $I_{set}$ of capacitor 136 is not affected by the base current $I_b$ drawn by transistor 122. The ramp generation and voltage coupling functions are effectively separated in the circuit of FIG. 3. Thus, the ramp slope remains accurate even for small values of charging current. In a preferred embodiment, transistors 102 and 134 are constructed such that equal base voltages produce equal collector currents. Thus, the current through resistor 106 is divided equally between transistors 102 and 134.

The circuit shown in FIG. 3 allows the transistor 134 to operate with a lower collector voltage than the transistor 60 in FIG. 2. Furthermore, the transistor 140 can be operated at a low collector voltage and enables a greater operating voltage to be applied to the DAC 28 than the circuit of FIG. 2. In a preferred embodiment, the collectors of transistors 134 and 140 can be operated down to about 0.8 volt without saturation. The circuit can be operated from a single supply voltage such as a single five volt supply, and can be operated from a supply voltage as low as four volts.

In a preferred embodiment, the transistors 108 and 140 are constructed such that the current through transistor 140 is four times the current through transistor 108. Since the nominal DAC current is 2.0 milliamps, the current through transistor 108 is 500 microamps, and the total reference current $I_{ref}$ is 2.5 milliamps. The operating voltage across resistors 106 and 112 is selected to be 0.4 volt. Thus, the value of resistor 112 is 160 ohms. As indicated previously, the value of resistor 106 is selectable depending on the desired time delay range. However, the voltage across resistor 106 is fixed by the voltage coupling circuit at 0.4 volt.

Figure 4:
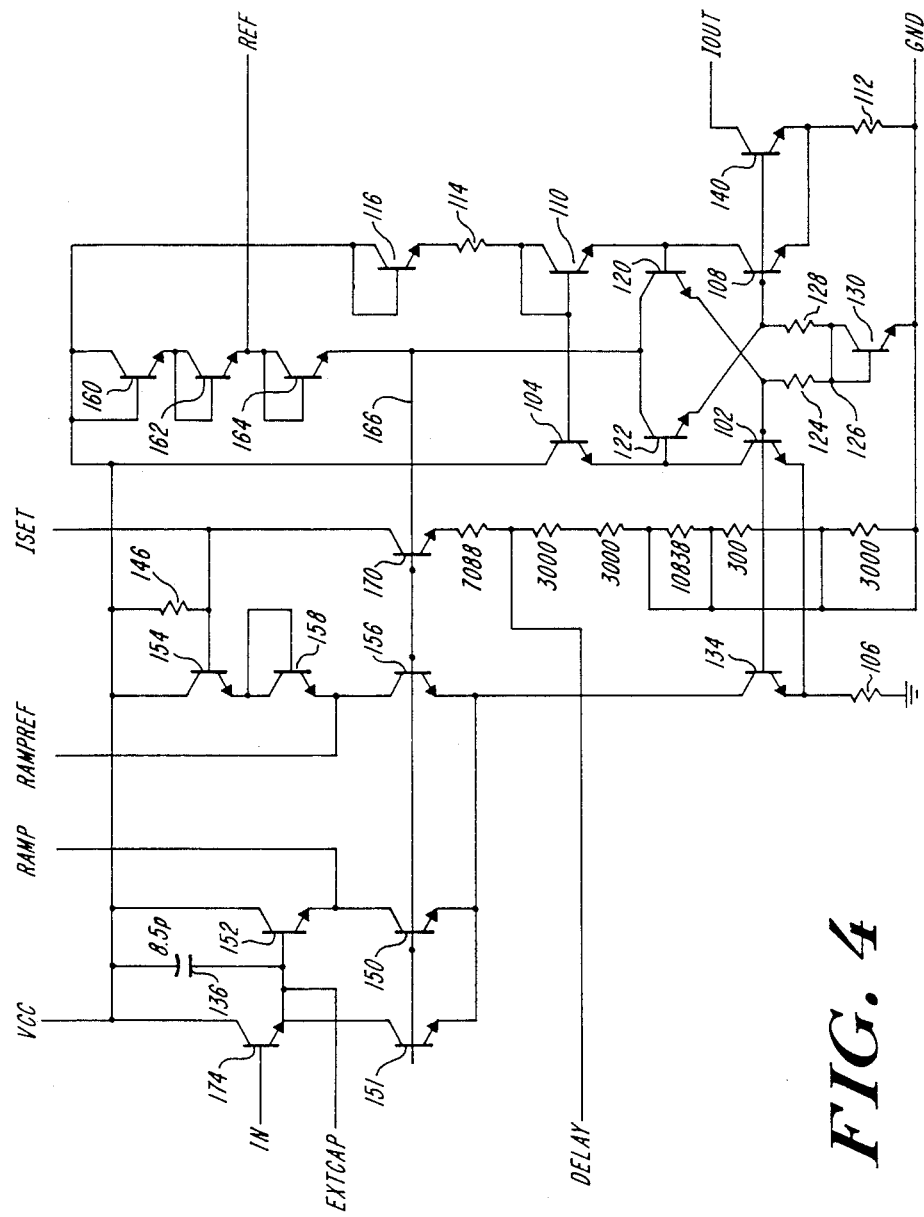
FIG. 4 is a detailed schematic diagram of a ramp generator and voltage coupling circuit in accordance with the present invention.

A detailed schematic diagram of a preferred embodiment of the ramp generator and voltage coupling circuit is shown in FIG. 4. Circuit components corresponding to those in FIG. 3 have the same reference numerals. The collector of transistor 134 is connected through a transistor 151 to ramp capacitor 136. A transistor 174 connected across ramp capacitor 136 is used to reset the ramp capacitor 136 after generation of the ramp voltage. Resistor 146 connected between the base of a transistor 154 and the positive supply voltage corresponds to threshold resistor 146 in FIG. 3. The DAC is connected to the junction of resistor 146 and the base of transistor 154. Transistors 154 and 156 and diode 158 establish a ramp reference voltage that is lower than the ramp voltage. The ramp reference voltage is used to set a reference voltage such as the voltage at node 25 in FIG. 1. This level determines the programmed time delay. Series connected diodes 160, 162 and 164 are connected to the collectors of transistors 120 and 122 and to the bases of transistors 150, 156 and 170. The diodes 160, 162 and 164 establish a voltage at node 166 that is three diode voltages below the positive supply voltage. The transistor 170 is used to lower the ramp reference voltage below the initial ramp. This insures that comparator 32 in FIG. 1 has an initial predetermined output state.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A digital to time converter circuit for converting the value of a digital word into a proportional time delay in response to a trigger signal, comprising:
   a digital-to analog converter having a first current path and a second current path connected in parallel to a current output, means for drawing a DAC current from said current output, and means responsive to said digital word for changing the magnitude of a first current flowing through said first current path;
   means for generating a threshold voltage proportional to said first current;
   a ramp capacitor;
   a ramp resistor connected in series with said ramp capacitor for charging said capacitor by means of a ramp current through said resistor to generate a ramp voltage;
   a reference resistor connected in series with said digital-to-analog converter for generating a reference voltage in response to said DAC current;
   a first transistor having a collector connected in series between said ramp capacitor and said ramp resistor;
   a second transistor having a collector connected in series between said digital to analog converter and said reference resistor;
   a third transistor having a base connected to a base of said first transistor;
   a fourth transistor having a base connected to a base of said second transistor, said bases of said first and third transistors being connected to the collector of said fourth transistor by means of a first emitter follower circuit, and said bases of said second and fourth transistors being connected being connected to the collector of said third transistor by means of a second emitter follower circuit so that the voltage across said reference resistor equals the voltage across said ramp resistor; and
   a differential comparator responsive to said ramp voltage and said threshold voltage for generating an output representative of said time delay.

2. A digital to time converter circuit as defined in claim 1 wherein said first and third transistors each include emitters connected to said ramp resistor.

3. A digital to time converter circuit as defined in claim 1 wherein said second and fourth transistors each include emitters connected to said reference resistor.

4. A digital-to time converter circuit a defined in claim 1 wherein said first emitter follower circuit includes a fifth transistor having a base connected to the collector of said fourth transistor and an emitter connected to the bases of said first and third transistors and wherein said second emitter follower circuit includes a sixth transistor having a base connected to the collector of said third transistor and an emitter connected to the bases of said second and fourth transistors.

5. A digital-to-time converter circuit as defined in claim 4 further including a seventh transistor connected in series between the collector of said third transistor and a supply voltage.

6. A digital-to time converter circuit as defined in claim 5 further including a first diode, a resistor and a second diode connected in series between the collector of said fourth transistor and the supply voltage, said first diode having a cathode connected to the collector of said fourth transistor.

7. A digital to time converter circuit as defined in claim 6 wherein said seventh transistor includes a base connected to an anode of said first diode.

8. In a digital-to time converter circuit which converts the value of a digital word into a proportional time delay in response to a trigger signal by generating a threshold voltage proportional to a DAC current that is supplied by a digital-to-analog converter in response to said digital word, charging a ramp capacitor with a ramp current through a ramp resistor to generate a ramp voltage and generating an output representative of said time delay in response to said ramp voltage and said threshold voltage, a voltage coupling circuit comprising:
   a reference resistor connected in series with said digital-to analog converter for generating a reference voltage in response to said DAC current;
   a first transistor having a collector connected in series between said ramp capacitor and said ramp resistor;
   a second transistor having a collector connected in series between said digital to analog converter and said reference resistor;
   a third transistor having a base connected to a base of said first transistor; and
   a fourth transistor having a base connected to a base of said second transistor, said bases of said first and third transistors being connected to the collector of said fourth transistor by means of a first emitter follower circuit, and said bases of said second and fourth transistors being connected to the collector of said third transistor by means of a second emitter follower circuit so that the voltage across said reference resistor equals the voltage across said ramp resistor.

9. A voltage coupling circuit as defined in claim 8 wherein said first and third transistors each include emitters connected to said ramp resistor.

10. A voltage coupling circuit as defined in claim 8 wherein said second and fourth transistors each include emitters connected to said reference resistor.

11. A voltage coupling circuit as defined in claim 8 wherein said first emitter follower circuit includes a fifth transistor having a base connected to the collector of said fourth transistor and an emitter connected to the bases of said first and third transistors and wherein said second emitter follower circuit includes a sixth transistor having a base connected to the collector of said third transistor and an emitter connected to the bases of said second and fourth transistors.

12. A voltage coupling circuit as defined in claim 11 further including a seventh transistor connected in series between the collector of said third transistor and a supply voltage.

13. A voltage coupling circuit as defined in claim 12 further including a first diode, a resistor and a second diode connected in series between the collector of said fourth transistor and the supply voltage, said first diode having a cathode connected to the collector of said fourth transistor.

14. A voltage coupling circuit as defined in claim 13 wherein said seventh transistor includes a base connected to an anode of said first diode.

* * * * *